(12) United States Patent
Yu et al.

(10) Patent No.: US 8,952,506 B2
(45) Date of Patent: Feb. 10, 2015

(54) THROUGH SILICON VIA STRUCTURE

(71) Applicant: Taiwan Semiconductor Manufacturing Company, Ltd., Hsin-Chu (TW)

(72) Inventors: Chen-Hua Yu, Hsin-Chu (TW); Shin-Puu Jeng, Hsin-Chu (TW); Wen-Chih Chiou, Zhunan Township (TW); Fang Wen Tsai, Hsin-Chu (TW); Chen-Yu Tsai, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/221,001

(22) Filed: Mar. 20, 2014

(65) Prior Publication Data

US 2014/0203439 A1  Jul. 24, 2014

Related U.S. Application Data

(62) Division of application No. 13/157,137, filed on Jun. 9, 2011, now Pat. No. 8,900,994.

(51) Int. Cl.
*H01L 23/495* (2006.01)
*H01L 23/48* (2006.01)
(Continued)

(52) U.S. Cl.
CPC ............. *H01L 23/481* (2013.01); *H01L 24/05* (2013.01); *H01L 21/6835* (2013.01); *H01L 25/0657* (2013.01); *H01L 2224/16145* (2013.01); *H01L 2224/03002* (2013.01); *H01L 24/03* (2013.01); *H01L 24/11* (2013.01); *H01L 24/13* (2013.01); *H01L 24/14* (2013.01); *H01L 24/16* (2013.01); *H01L 2221/68372* (2013.01); *H01L 2224/0345* (2013.01); *H01L 2224/03452* (2013.01); *H01L 2224/03462* (2013.01); *H01L 2224/0347* (2013.01); *H01L 2224/0391* (2013.01);
(Continued)

(58) Field of Classification Search
USPC ............................ 257/667; 438/112, 455, 589
See application file for complete search history.

(56) References Cited

U.S. PATENT DOCUMENTS 5,391,917 A  2/1995  Gilmour et al.
5,426,072 A  6/1995  Finnila
(Continued)

FOREIGN PATENT DOCUMENTS

CN  101752336  6/2010
JP  2009004730  1/2009
(Continued)

OTHER PUBLICATIONS

Ranganathan, N., et al., "Integration of High Aspect Ratio Tapered Silicon Via for Through-Silicon Interconnection," 2008 Electronic Components and Technology Conference, 2008, pp. 859-865.

*Primary Examiner* — Phuc Dang
(74) *Attorney, Agent, or Firm* — Slater & Matsil, L.L.P.

(57) ABSTRACT

A system and method for manufacturing a through silicon via is disclosed. An embodiment comprises forming a through silicon via with a liner protruding from a substrate. A passivation layer is formed over the substrate and the through silicon via, and the passivation layer and liner are recessed from the sidewalls of the through silicon via. Conductive material may then be formed in contact with both the sidewalls and a top surface of the through silicon via.

20 Claims, 5 Drawing Sheets

(51) Int. Cl.
*H01L 23/00* (2006.01)
*H01L 21/683* (2006.01)
*H01L 25/065* (2006.01)

(52) U.S. Cl.
CPC .............. *H01L2224/0401* (2013.01); *H01L 2224/05008* (2013.01); *H01L 2224/05018* (2013.01); *H01L 2224/05025* (2013.01); *H01L 2224/05073* (2013.01); *H01L 2224/05144* (2013.01); *H01L 2224/05147* (2013.01); *H01L 2224/05155* (2013.01); *H01L 2224/05166* (2013.01); *H01L 2224/05548* (2013.01); *H01L 2224/05559* (2013.01); *H01L 2224/05562* (2013.01); *H01L 2224/05647* (2013.01); *H01L 2224/13023* (2013.01); *H01L 2224/14181* (2013.01); *H01L 2224/16227* (2013.01); *H01L 2225/06517* (2013.01); *H01L 2224/05568* (2013.01); *H01L 2224/1411* (2013.01); *H01L 2224/05023* (2013.01); *H01L 2225/06513* (2013.01); *H01L 2225/06541* (2013.01); *H01L 2224/16225* (2013.01)
USPC .................. 257/667; 257/763; 438/112

(56) References Cited

U.S. PATENT DOCUMENTS

| | | |
|---|---|---|
| 5,510,298 A | 4/1996 | Redwine |
| 5,646,067 A | 7/1997 | Gaul |
| 5,767,001 A | 6/1998 | Bertagnolli et al. |
| 5,998,292 A | 12/1999 | Black et al. |
| 6,034,436 A | 3/2000 | Iwasaki |
| 6,184,060 B1 | 2/2001 | Siniaguine |
| 6,322,903 B1 | 11/2001 | Siniaguine et al. |
| 6,417,087 B1 | 7/2002 | Chittipeddi et al. |
| 6,448,168 B1 | 9/2002 | Rao et al. |
| 6,451,684 B1 | 9/2002 | Kim et al. |
| 6,465,892 B1 | 10/2002 | Suga |
| 6,472,293 B1 | 10/2002 | Suga |
| 6,498,381 B2 | 12/2002 | Halahan et al. |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,764,950 B2 | 7/2004 | Noguchi et al. |
| 6,770,528 B2 | 8/2004 | Furukawa et al. |
| 6,800,930 B2 | 10/2004 | Jackson et al. |
| 6,838,774 B2 | 1/2005 | Patti |
| 6,841,883 B1 | 1/2005 | Farnworth et al. |
| 6,873,054 B2 | 3/2005 | Miyazawa et al. |
| 6,882,030 B2 | 4/2005 | Siniaguine |
| 6,897,125 B2 | 5/2005 | Morrow et al. |
| 6,908,856 B2 | 6/2005 | Beyne et al. |
| 6,914,336 B2 | 7/2005 | Matsuki et al. |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,015,581 B2 | 3/2006 | Casey et al. |
| 7,030,481 B2 | 4/2006 | Chudzik et al. |
| 7,049,170 B2 | 5/2006 | Savastiouk et al. |
| 7,053,465 B2 | 5/2006 | Benaissa et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,186,343 B2 | 3/2007 | Rabie et al. |
| 7,186,643 B2 | 3/2007 | Ahn et al. |
| 7,193,308 B2 | 3/2007 | Matsui |
| 7,224,063 B2 | 5/2007 | Agarwala et al. |
| 7,262,495 B2 | 8/2007 | Chen et al. |
| 7,297,574 B2 | 11/2007 | Thomas et al. |
| 7,300,857 B2 | 11/2007 | Akram et al. |
| 7,335,972 B2 | 2/2008 | Chanchani |
| 7,354,798 B2 | 4/2008 | Pogge et al. |
| 7,355,273 B2 | 4/2008 | Jackson et al. |
| 7,358,180 B2 | 4/2008 | Sakai et al. |
| 7,514,775 B2 | 4/2009 | Chao et al. |
| 7,528,068 B2 | 5/2009 | Soejima et al. |
| 7,541,677 B2 | 6/2009 | Kawano |
| 7,544,605 B2 | 6/2009 | Sparks et al. |
| 7,772,081 B2 | 8/2010 | Lin et al. |
| 7,772,116 B2 | 8/2010 | Akram et al. |
| 7,816,227 B2 | 10/2010 | Chen et al. |
| 7,855,455 B2 | 12/2010 | Purushothaman et al. |
| 7,863,187 B2 | 1/2011 | Hiatt et al. |
| 7,915,710 B2 | 3/2011 | Lee et al. |
| 7,919,835 B2 | 4/2011 | Akiyama |
| 7,968,460 B2 | 6/2011 | Kirby et al. |
| 7,969,016 B2 | 6/2011 | Chen et al. |
| 7,973,415 B2 | 7/2011 | Kawashita et al. |
| 7,999,320 B2 | 8/2011 | Botula et al. |
| 8,026,592 B2 | 9/2011 | Yoon et al. |
| 8,034,704 B2 | 10/2011 | Komai et al. |
| 8,058,708 B2 | 11/2011 | Maebashi |
| 8,097,961 B2 | 1/2012 | Tanaka et al. |
| 8,097,964 B2 | 1/2012 | West et al. |
| 8,174,124 B2 | 5/2012 | Chiu et al. |
| 8,193,092 B2 | 6/2012 | Pratt |
| 8,247,322 B2 | 8/2012 | Chang et al. |
| 8,264,077 B2 | 9/2012 | Chiou et al. |
| 8,294,261 B2 | 10/2012 | Mawatari et al. |
| 8,399,354 B2 | 3/2013 | Chen |
| 8,466,059 B2 | 6/2013 | Chang et al. |
| 8,513,119 B2 | 8/2013 | Chang et al. |
| 8,513,778 B2 | 8/2013 | Tokitoh |
| 2002/0084513 A1 | 7/2002 | Siniaguine |
| 2002/0113321 A1 | 8/2002 | Siniaguine |
| 2002/0182855 A1 | 12/2002 | Agarwala |
| 2003/0148600 A1 | 8/2003 | Furukawa et al. |
| 2004/0048459 A1 | 3/2004 | Patti |
| 2004/0188822 A1 | 9/2004 | Hara |
| 2004/0245623 A1 | 12/2004 | Hara et al. |
| 2004/0248398 A1 | 12/2004 | Ahn |
| 2005/0194691 A1 | 9/2005 | Sakai et al. |
| 2005/0200025 A1 | 9/2005 | Casey et al. |
| 2005/0221601 A1 | 10/2005 | Kawano |
| 2005/0233581 A1 | 10/2005 | Soejima et al. |
| 2006/0273465 A1 | 12/2006 | Tamura |
| 2006/0289968 A1 | 12/2006 | Sulfridge |
| 2007/0032061 A1 | 2/2007 | Farnworth et al. |
| 2007/0049016 A1 | 3/2007 | Hiatt et al. |
| 2007/0172985 A1 | 7/2007 | Huang et al. |
| 2008/0054444 A1 | 3/2008 | Tuttle |
| 2008/0136023 A1 | 6/2008 | Komai et al. |
| 2008/0211106 A1 | 9/2008 | Chang et al. |
| 2008/0315433 A1 | 12/2008 | Chen et al. |
| 2009/0014843 A1 | 1/2009 | Kawashita et al. |
| 2009/0032960 A1 | 2/2009 | Pratt |
| 2009/0032966 A1 | 2/2009 | Lee et al. |
| 2009/0057909 A1 | 3/2009 | Strothmann |
| 2009/0149023 A1 | 6/2009 | Koyanagi |
| 2009/0152602 A1 | 6/2009 | Akiyama |
| 2009/0250739 A1 | 10/2009 | Johnson et al. |
| 2009/0269905 A1 | 10/2009 | Chen et al. |
| 2009/0283898 A1 | 11/2009 | Janzen et al. |
| 2009/0315184 A1 | 12/2009 | Tokitoh |
| 2010/0013060 A1 | 1/2010 | Lamy et al. |
| 2010/0038800 A1 | 2/2010 | Yoon et al. |
| 2010/0078770 A1 | 4/2010 | Purushothaman et al. |
| 2010/0127394 A1 | 5/2010 | Ramiah et al. |
| 2010/0140805 A1 | 6/2010 | Chang et al. |
| 2010/0164117 A1* | 7/2010 | Chen .................. 257/774 |
| 2010/0171197 A1 | 7/2010 | Chang et al. |
| 2010/0171226 A1 | 7/2010 | West et al. |
| 2010/0176494 A1 | 7/2010 | Chen |
| 2010/0330798 A1 | 12/2010 | Huang et al. |
| 2011/0049706 A1 | 3/2011 | Huang et al. |
| 2011/0068466 A1 | 3/2011 | Chen et al. |
| 2011/0165776 A1 | 7/2011 | Hsu et al. |
| 2011/0186990 A1 | 8/2011 | Mawatari et al. |

(56) References Cited

U.S. PATENT DOCUMENTS

| | | |
|---|---|---|
| 2011/0204969 A1 | 8/2011 | Chen et al. |
| 2011/0227216 A1 | 9/2011 | Tseng et al. |
| 2011/0233785 A1 | 9/2011 | Koester et al. |
| 2011/0241217 A1* | 10/2011 | Chang et al. .................. 257/774 |
| 2011/0266691 A1 | 11/2011 | Lin et al. |
| 2011/0318917 A1 | 12/2011 | Yoon et al. |
| 2012/0001337 A1* | 1/2012 | Tsai et al. .................... 257/770 |
| 2012/0018863 A1* | 1/2012 | Oganesian et al. ........... 257/676 |
| 2012/0211892 A1* | 8/2012 | Kim et al. ..................... 257/774 |
| 2012/0295437 A1* | 11/2012 | Lu et al. ....................... 438/653 |
| 2013/0001799 A1 | 1/2013 | Chang et al. |
| 2013/0299992 A1 | 11/2013 | Chang et al. |
| 2014/0225277 A1 | 8/2014 | Chang et al. |

FOREIGN PATENT DOCUMENTS

| | | |
|---|---|---|
| JP | 2009147218 | 7/2009 |
| KR | 1020060054688 | 5/2006 |
| KR | 1020060054689 | 5/2006 |
| KR | 1020060054690 | 5/2006 |
| KR | 1020080101635 | 11/2008 |
| TW | 531892 | 5/2003 |
| TW | 200737551 | 10/2007 |
| TW | 200910557 | 3/2009 |
| TW | 201036106 | 10/2010 |

\* cited by examiner

US 8,952,506 B2

THROUGH SILICON VIA STRUCTURE

PRIORITY CLAIM AND CROSS-REFERENCE

This application is a divisional of U.S. patent application Ser. No. 13/157,137 entitled "Through Silicon Via Structure and Method" filed on Jun. 9, 2011, which application is hereby incorporated herein by reference.

BACKGROUND

Generally, through silicon vias may be formed in a semiconductor substrate in order to provide electrical connections to a backside of the semiconductor substrate. By providing such an electrical connection, the possibility of connecting the semiconductor substrate may be expanded beyond electrical connections located on only a single side of the semiconductor substrate as in previous generations of semiconductor processes. This expansion allows for, among other things, a three-dimensional stacking of semiconductor dies, with connections going through the through silicon vias and providing power, ground, and signal lines throughout the three-dimensional stack.

To form the through silicon vias, an opening may be formed on an active side of the semiconductor substrate, wherein the opening extends into the semiconductor substrate further than active devices located in or on the semiconductor substrate. These openings may then be filled with a conductive material. After the openings have been filled, the backside of the semiconductor substrate may be thinned through, e.g., a chemical mechanical polishing (CMP) or etching process in order to expose the conductive material, thereby leaving a planar surface between the conductive material and the surrounding materials. A conductive glue layer may then be formed over the planar surface in order to provide an interface between the through silicon via and a contact to be formed.

However, the relatively smaller diameter of the through silicon via in relation to the contact can cause a non-uniform current distribution known as current crowding to occur at the interface between the through silicon via and the glue layer. This current crowding, in addition to being a problem in itself, can also induce electromagnetic failure and cause the formation of hillocks and voids within the structure.

BRIEF DESCRIPTION OF THE DRAWINGS

For a more complete understanding of the embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a through silicon via. The embodiments may also be applied, however, to other conductive contacts.

Figure 1:
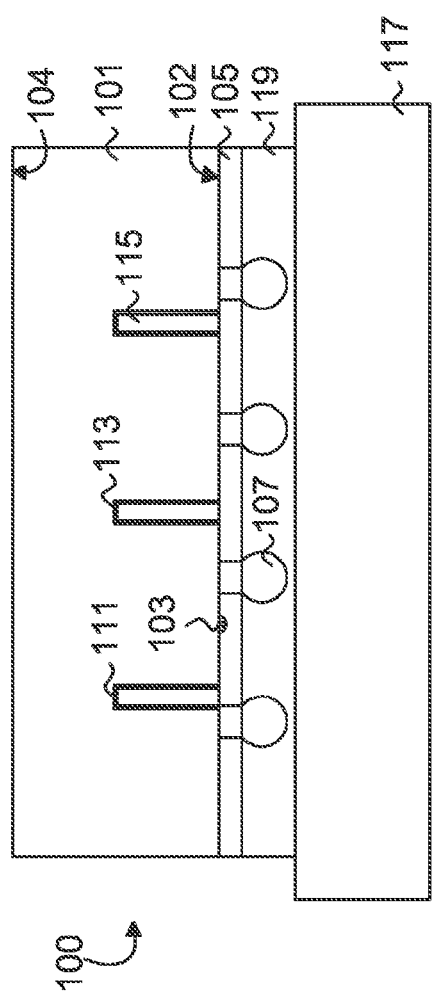
FIG. 1 illustrates a semiconductor substrate with a conductive opening attached to a carrier in accordance with an embodiment.

With reference now to FIG. 1, there is shown a semiconductor die 100 having a semiconductor substrate 101 with a first side 102 and a second side 104. The first side 102 of the semiconductor substrate 101 may have TSV openings 111 formed therein and active devices 103, metallization layers 105, and first conductive bumps 107 formed therein and thereon. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The through silicon via (TSV) openings 111 may be formed into the first side 102 of the semiconductor substrate 101. The TSV openings 111 may be formed by applying and developing a suitable photoresist (not shown), and removing semiconductor substrate 101 that is exposed to the desired depth. The TSV openings 111 may be formed so as to extend into the semiconductor substrate 101 at least further than the active devices 103 formed within and/or on the semiconductor substrate 101, and may extend to a depth greater than the eventual desired height of the semiconductor substrate 101. Accordingly, while the depth is dependent upon the overall design of the semiconductor die 100, the depth may be between about 20 μm and about 200 μm from the active devices 103 on the semiconductor substrate 101, such as a depth of about 100 μm from the active devices 103 on the semiconductor substrate 101.

Once the TSV openings 111 have been formed within the semiconductor substrate 101, the TSV openings 111 may be lined with a liner 113. The liner 113 may be, e.g., an oxide formed from tetraethylorthosilicate (TEOS) or silicon nitride, although any suitable dielectric material may alternatively be used. The liner 113 may be formed using a plasma enhanced chemical vapor deposition (PECVD) process, although other suitable processes, such as physical vapor deposition or a thermal process, may alternatively be used. Additionally, the liner 113 may be formed to a thickness of between about 0.1 μm and about 5 μm, such as about 1 μm.

Once the liner 113 has been formed along the sidewalls and bottom of the TSV openings 111, a barrier layer (not shown) may be formed and the remainder of the TSV openings 111 may be filled with first conductive material 115. The first conductive material 115 may comprise copper, although other suitable materials such as aluminum, alloys, doped polysilicon, combinations thereof, and the like, may alternatively be utilized. The first conductive material 115 may be formed by electroplating copper onto a seed layer (not shown), filling and overfilling the TSV openings 111. Once the TSV openings 111 have been filled, excess liner 113, barrier layer, seed layer, and first conductive material 115 outside of the TSV openings 111 may be removed through a planarization process such as chemical mechanical polishing (CMP), although any suitable removal process may be used.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor die 100. The active devices 103 may be formed using any suitable methods either within or else on the first side 102 of the semiconductor substrate 101.

The metallization layers 105 are formed over the first side 102 of the semiconductor substrate 101 and the active devices 103 and are designed to connect the various active devices 103 to form functional circuitry. While illustrated in FIG. 1 as a single layer of dielectric and interconnects, the metallization layers 105 are formed of alternating layers of dielectric and conductive material and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 105 is dependent upon the design of the semiconductor die 100.

FIG. 1 also illustrates the formation of first conductive bumps 107 on the first side 102 of the semiconductor substrate 101. The first conductive bumps 107 may comprise a material such as tin, or other suitable materials, such as silver or copper. In an embodiment in which the first conductive bumps 107 are tin solder bumps, the first conductive bumps 107 may be formed by initially forming a layer of tin through such commonly used methods such as evaporation, electroplating, printing, solder transfer, ball placement, etc, to a thickness of, e.g., about 10 µm to about 100 µm. Once a layer of tin has been formed on the structure, a reflow may be performed in order to shape the material into the desired bump shape.

Once the processes performed on the first side 102 of the semiconductor substrate 101 have reached a suitable point for processing to occur on the second side 104 of the semiconductor substrate 101, a carrier 117 may be attached to the semiconductor die 100 with an adhesive 119. The carrier 117 may comprise, for example, glass, silicon oxide, aluminum oxide, and the like. In an embodiment, the adhesive 119 may be used to glue the carrier 117 to the semiconductor die 100. The adhesive 119 may be any suitable adhesive, such as an ultraviolet (UV) glue, which loses its adhesive property when exposed to UV lights. The carrier may have a thickness that may be greater than about 12 mils.

Alternatively, the carrier 117 may comprise a suitable carrier tape. If a carrier tape is utilized, the carrier tape may be the commonly known blue tape. The carrier tape may be attached to the semiconductor die 100 using a second adhesive (not shown) located on the carrier tape.

Figure 2:
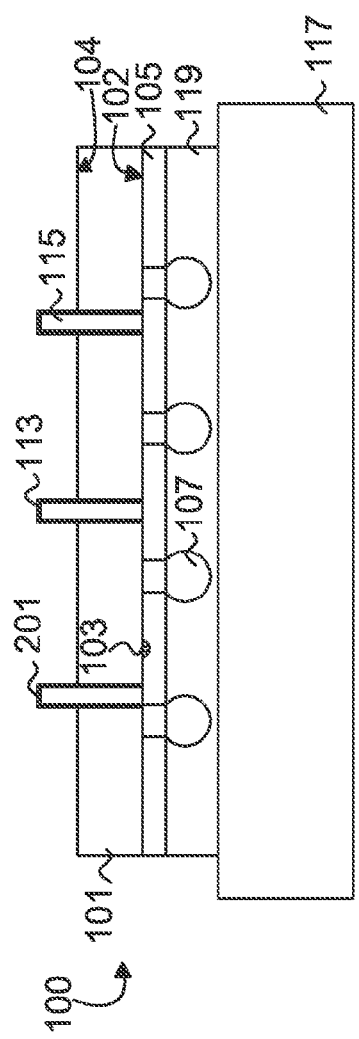
FIG. 2 illustrates a thinning of a second side of the semiconductor substrate in accordance with an embodiment.

FIG. 2 illustrates a thinning of the second side 104 of the semiconductor substrate 101 in order to expose the TSV openings 111 (see FIG. 1 discussed above) and form TSVs 201 from the first conductive material 115 that extends through the semiconductor substrate 101. In an embodiment, the thinning of the second side 104 of the semiconductor substrate 101 may leave the TSVs 201 lined by the liners 113. The thinning of the second side 104 of the semiconductor substrate 101 may be performed by a combination of CMP and etching. For example, a CMP process may be performed in order to remove a bulk of the semiconductor substrate 101. Once a bulk of the second side 104 of the semiconductor substrate 101 has been removed, an etching process may then be employed to recess the second side 104 of the semiconductor substrate 101 and allow the TSVs 201 to protrude from the second side 104 of the semiconductor substrate 101. In an embodiment the TSVs 201 may protrude from the second side 104 of the semiconductor substrate 101 a distance of between about 0.5 µm and about 10 µm, such as about 5 µm.

As one of ordinary skill in the art will recognize, the above-described process for forming the TSVs 201 is merely one method of forming the TSVs 201, and other methods are also fully intended to be included within the scope of the embodiments. For example, forming the TSV openings 111, filling the TSV openings 111 with a dielectric material, thinning the second side 104 of the semiconductor substrate 101 to expose the dielectric material, removing the dielectric material, and filling the TSV openings 111 with a conductor prior to recessing the second side 104 of the semiconductor substrate 101 may also be used. This and all other suitable methods for forming the TSVs 201 into the first side 102 of the semiconductor substrate 101 are fully intended to be included within the scope of the embodiments.

Alternatively, the TSVs 201 may be formed to extend through the metallization layers 105. For example, the TSVs 201 may be formed either after the formation of the metallization layers 105 or else even partially concurrently with the metallization layers 105. For example, the TSV openings 111 may be formed in a single process step through both the metallization layers 105 and the semiconductor substrate 101. Alternatively, a portion of the TSV openings 111 may be formed and filled within the semiconductor substrate 101 prior to the formation of the metallization layers 105, and subsequent layers of the TSV openings 111 may be formed and filled as each of the metallization layers 105 are individually formed. Any of these processes, and any other suitable process by which the TSVs 201 may be formed, are fully intended to be included within the scope of the embodiments.

Figure 3:
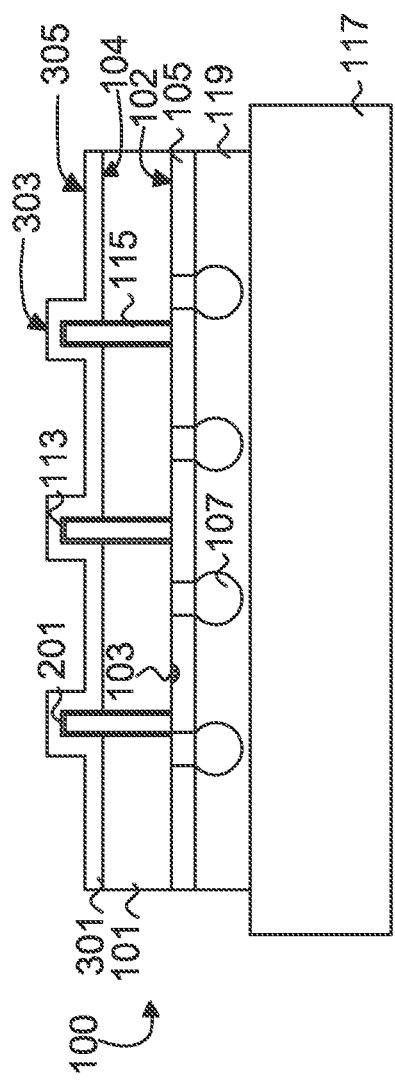
FIG. 3 illustrates the formation of a passivation layer over the through silicon vias in accordance with an embodiment.

FIG. 3 illustrates the formation of a first passivation layer 301 over the second side 104 of the semiconductor substrate 101 and over the TSVs 201 and liners 113 protruding from the second side 104 of the semiconductor substrate 101. The first passivation layer 301 may be a dielectric material similar to the liner 113, such as silicon nitride, but may alternatively be a different material such as silicon carbide, silicon oxynitride, silicon oxide, polymer materials, combinations of these, or the like. Additionally, the first passivation layer 301 may be a single layer of material or may be a composite layer with multiple sublayers of different materials. The first passivation layer 301 may be formed using a PECVD process, although any other suitable process may alternatively be used.

The first passivation layer 301 may be formed conformally over the second side 104 of the semiconductor substrate 101 and the TSVs 201, and may be formed to have a thickness of between about 0.1 µm and about 5 µm, such as about 1 µm. By forming the first passivation layer 301 conformally, the first passivation layer 301 may have two upper surfaces, a top upper surface 303 located above the tops of the TSVs 201 and a bottom upper surface 305 located below the tops of the TSVs 201.

Figure 4:
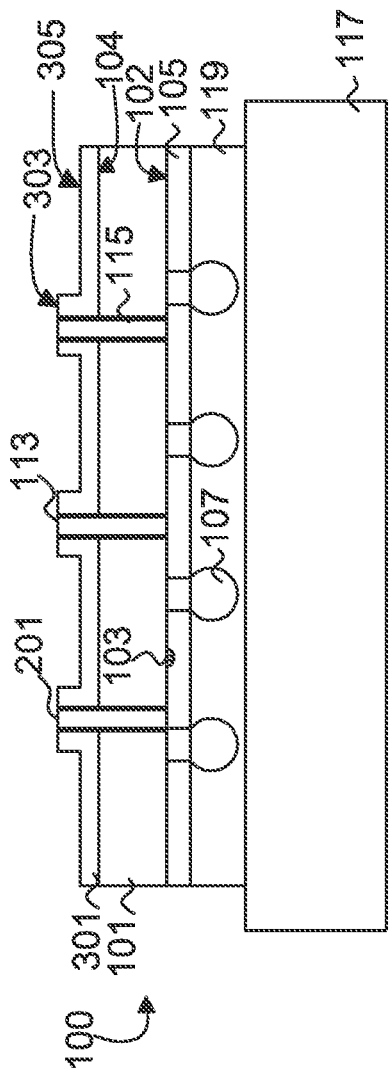
FIG. 4 illustrates the planarization of the passivation layer in accordance with an embodiment.

FIG. 4 illustrates that, once the first passivation layer 301 has been formed, the first passivation layer 301, the liner 113, and the first conductive material 115 may be planarized in order to expose the first conductive material 115 within the TSVs 201. The planarization may be performed, e.g., through a CMP process or other suitable planarization process, and may be continued at least until the first conductive material 115 of the TSVs 201 is exposed through the first passivation layer 301 as well as the liner 113. Additionally, the planarization process may be stopped to preserve the separation of the top upper surface 303 and the bottom upper surface 305 of the first passivation layer 301. As such, the first passivation layer 301 retains a portion of the first passivation layer 301 along a sidewall of the liners 113 and the TSVs 201.

Figure 5:
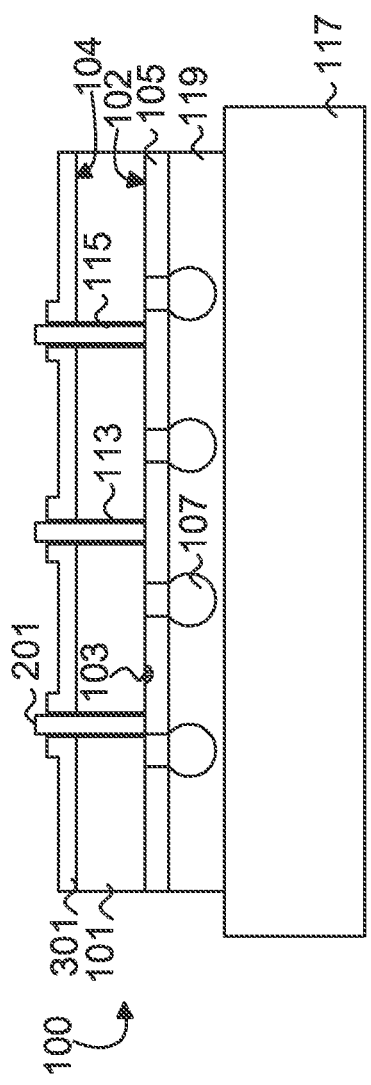
FIG. 5 illustrates a recessing of the passivation layer and a liner in accordance with an embodiment.

FIG. 5 illustrates a recessing of the first passivation layer 301 and the liner 113 from the sidewalls of the TSVs 201. In an embodiment in which the first passivation layer 301 and the liner 113 are a similar material such as silicon nitride, the first passivation layer 301 and the liner 113 may be removed simultaneously through, e.g., a wet or dry etch using an etchant, such as $C_xF_y$ or HF, that is selective to the silicon nitride and will not significantly remove the first conductive material 115 from the TSVs 201.

The recessing of the first passivation layer 301 and the liner 113 may continue until the sidewalls of the TSVs 201 protrude between about 0.1 µm and about 5 µm from the first passivation layer 301, such as about 1 µm. However, the recessing may be stopped prior to the complete removal of the first passivation layer 301 and the liner 113 from the sidewalls of the TSVs 201. As such, a stair step pattern may be formed between the bottom upper surface 305 of the first passivation layer 301; the top upper surface 303 and the liner 113; and the top surface of the TSVs 201.

In an embodiment in which the first passivation layer 301 and the liner 113 are similar materials, such as materials that have a similar etch selectivity, the first passivation layer 301 and the liner 113 may be recessed in a single process step. Alternatively, if the first passivation layer 301 and the liner 113 are different materials, or even if separate process steps are desired, the first passivation layer 301 may be recessed in one process step and the liner 113 may be recessed in a separate process step. As such, the first passivation layer 301 may be either recessed more or less than the liner 113 as, for example, the TSVs 201 may protrude from the liner 113 a distance of about 0.1 µm to about 5 µm, such as about 2 µm, and may protrude from the first passivation layer 301 a distance of about 0.1 µm to about 5 µm, such as about 2 µm. Any suitable combination of process steps used to recess the first passivation layer 301 and the liner 113 may alternatively be used, and all such combinations are fully intended to be included within the embodiments.

Figure 6:
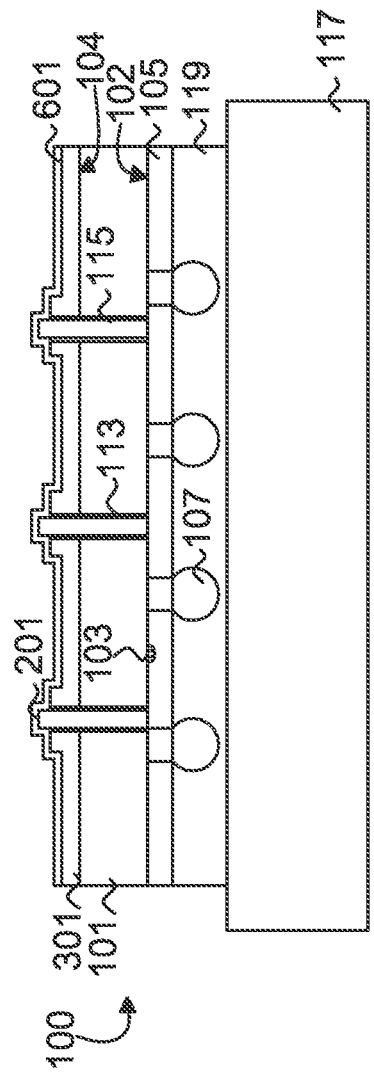
FIG. 6 illustrates the formation of a glue layer in accordance with an embodiment.

FIG. 6 illustrates the formation of a glue layer 601 over the first passivation layer 301, the liner 113, and the TSVs 201. The glue layer 601 helps to adhere the first passivation layer 301, the liner 113, and the TSVs 201 to subsequently formed materials, such as a seed layer (not shown in FIG. 6 but shown and discussed below with respect to FIG. 7). The glue layer 601 may be titanium, titanium nitride, tantalum, tantalum nitride, combinations of these, or the like, and may be formed through a process such as CVD, although any suitable process may alternatively be used. Additionally, the glue layer 601 may be formed to a thickness of between about 50 Å and about 3,000 Å, such as about 1,000 Å.

Figure 7:
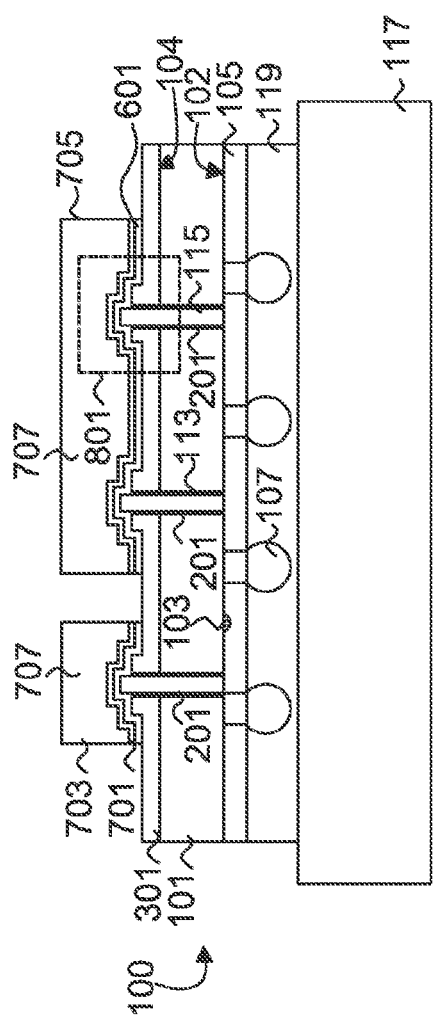
FIG. 7 illustrates the formation of a seed layer, a contact pad, and a redistribution layer in accordance with an embodiment.

FIG. 7 illustrates the formation of a seed layer 701, a contact pad 703, and a redistribution layer 705. The seed layer 701 may be used as an initiator for the further deposition of material to form the contact pad 703 and the redistribution layer 705. The seed layer 701 may be deposited by PVD, CVD, sputtering, or the like, and may be formed of copper, nickel, gold, a titanium copper alloy, combinations of these, or the like, although other methods and materials may alternatively be used if desired. Additionally, the seed layer 401 may have a thickness of between about 50 Å and about 5,000 Å.

Once the seed layer 701 has been formed, a photoresist (not shown) may be formed to cover the seed layer 701, and the photoresist may be patterned to expose those portions of the seed layer 701 that are located where the contact pad 703 and redistribution layer 705 are desired. For example, the photoresist may be patterned to form the shape of the contact pad 703 over one of the TSVs 201 while the photoresist may also be patterned over two other TSVs 201 in order to provide a redistribution layer 705 to connect the two TSVs 201.

After the photoresist has been patterned, second conductive material 707 may be plated onto the seed layer 701 to form the contact pad 703 and the redistribution layer 705. The second conductive material 707 may comprise copper, although other suitable materials such as aluminum, alloys, doped polysilicon, combinations thereof, and the like, may alternatively be utilized. The second conductive material 707 may be formed to a thickness of between about 1 µm and about 10 µm, such as about 3 µm, and may be formed by electroplating copper onto the patterned seed layer 701, although any suitable alternative process for the formation of the second conductive material 707 may alternatively be utilized.

Once the second conductive material 707 has been formed, the photoresist may be removed through a suitable removal process such as ashing. Additionally, after the removal of the photoresist, those portions of the seed layer 701 that were covered by the photoresist may be removed through, for example, a suitable etch process using the second conductive material 707 as a mask.

Figure 8:
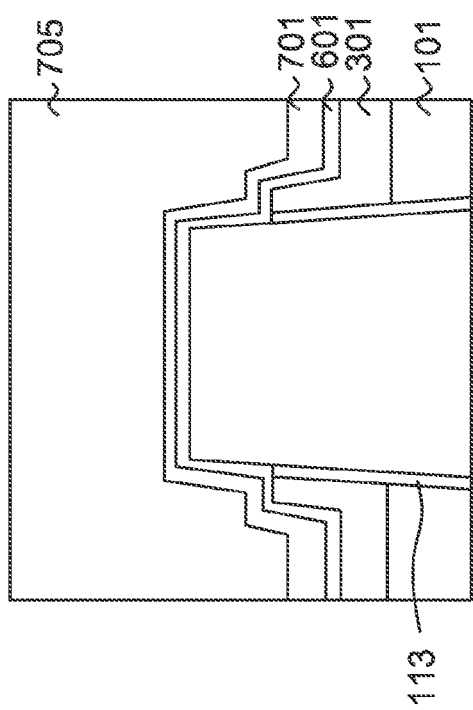
FIG. 8 illustrates a close up view of an interface between the through silicon via and the glue layer in accordance with an embodiment.

FIG. 8 illustrates a close-up of region 801 in FIG. 7 and, in particular, shows a close-up of the interface region between one of the TSVs 201 and the redistribution layer 705. As can be seen, by partially recessing the liner 113 and the first passivation layer 301 from the sidewalls of the TSVs 201, the surface area of the interface between the TSVs 201 and the glue layer 601 is increased beyond simply the top surface of TSVs 201. By increasing the surface area of the interface, the current crowding problem between the TSVs 201 and the redistribution layer 705 (and other contacts) may be reduced, thereby providing for a more efficient system along with a reduction in the formation of voids and hillocks.

Figure 9:
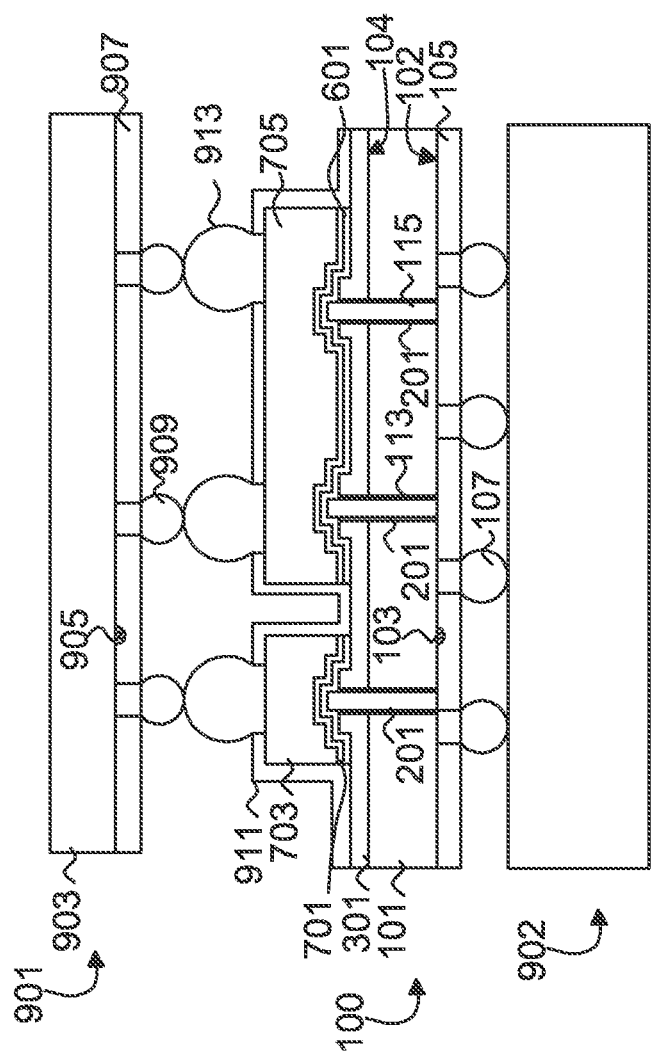
FIG. 9 illustrates the bonding of the semiconductor die to a first external device and a second external device in accordance with an embodiment.

FIG. 9 illustrates the placement of the TSVs 201 within the semiconductor die 100 in contact with a first external device 901 and a second external device 902 in, e.g., a stacked configuration. In an embodiment, a second passivation layer 911 may be formed over the first passivation layer 301 and over the contact pad 703 and redistribution layer 705. The second passivation layer 911 may be similar to the first passivation layer 301, such as being a layer of silicon nitride formed through a PECVD process. However, the second passivation layer 911 may alternatively be other materials such as silicon carbide, silicon oxynitride, silicon oxide, polymer materials, combinations of these, or the like, and may be formed by any suitable process. Additionally, the second passivation layer 911 may be formed to a thickness of between about 0.1 µm and about 5 µm, such as about 1 µm.

Once formed, the second passivation layer 911 may be patterned in order to expose the contact pad 703 and the redistribution layer 705. The patterning of the second passivation layer 911 may be performed using a photolithographic masking and etching process, whereby a photoresist (not shown) is formed over the second passivation layer 911 and exposed to a desired pattern. After exposure, the photoresist is developed to remove the desired portions of the second passivation layer 911 and expose the underlying portions of the contact pad 703 and the redistribution layer 705.

Once the desired portions of the contact pad 703 and the redistribution layer 705 have been exposed, second conductive bumps 913 may be formed to establish an electrical connection to the contact pad 703 and the redistribution layer 705. The second conductive bumps 913 may be formed in a similar fashion and of similar materials as the first conductive bumps 107 (discussed above with respect to FIG. 1). However, the second conductive bumps 913 may alternatively be formed of different process or materials than the first conductive bumps 107.

The first external device 901 may be, for example, a printed circuit board, a semiconductor packaging substrate, or, as illustrated in FIG. 9, a second semiconductor die with a second substrate 903, second active devices 905, second metallization layers 907, and third conductive bumps 909. However, the first external device 901 is not meant to be limited to any of the illustrative devices listed herein, and may alternatively be any device suitable for contacting to the semiconductor die 100.

The second external device 902, similar to the first external device 901, may also be, e.g., a third semiconductor die, a semiconductor packaging substrate, or, as illustrated in FIG. 9, a printed circuit board. Again, however, the second external device 902 is not meant to be limited to any of the illustrative devices listed herein, and may alternatively be any device suitable for contacting to the semiconductor die 100.

In the embodiment illustrated in FIG. 9, the semiconductor die 100 may be connected to the first external device 901 and the second external device 902 in, e.g., a stacked flip-chip configuration. In this embodiment, the semiconductor die 100 is positioned such that the second conductive bumps 913 are in physical contact with the third conductive bumps 909 and also positioned such that the first conductive bumps 107 are in physical contact with the second external device 902. Once in position, the first conductive bumps 107, the second conductive bumps 913 and the third conductive bumps 909 are heated and pressure is applied in order to liquefy the first conductive bumps 107, the second conductive bumps 913 and the third conductive bumps 909 and bond the third conductive bumps 909 to the second conductive bumps 913 and bond the first conductive bumps 107 to the second external device 902. This reflow helps to establish an electrical contact between the second conductive bumps 913 of the semiconductor die 100 with the third conductive bumps 909 of the first external device 901 and establishes another electrical contact between the first conductive bumps 107 with the second external device 902.

In accordance with an embodiment, a method comprising forming a through silicon via in a substrate, the through silicon via having sidewalls covered by a liner, is provided. A passivation layer is formed conformally over the substrate and over the liner, and the passivation layer and the liner are recessed to expose the sidewalls of the through silicon via. A conductive material is formed in contact with the sidewalls of the through silicon via.

In accordance with another embodiment, a method comprising forming a liner in an opening in a first side of a semiconductor substrate and filling the opening with a first conductive material is provided. A second side of the semiconductor substrate is thinned to expose the liner and the semiconductor substrate is recessed such that the first conductive material protrudes from the second side of the semiconductor substrate. A passivation layer is formed over the second side of the semiconductor substrate and the first conductive material, the passivation layer having a first portion adjacent to and in contact with the second side and a second portion over the first portion and extending along a sidewall of the first conductive material. The first portion of the passivation layer and the liner are recessed to expose a sidewall of the first conductive material, and a second conductive material is formed in physical contact with the sidewall and a top surface of the first conductive material.

In accordance with yet another embodiment, a semiconductor device comprising a through silicon via protruding from a substrate, the through silicon via having a sidewall is provided. A liner extends along the sidewall away from the substrate, the liner terminating prior to reaching a top surface of the through silicon via. A passivation layer comprises a first upper surface a first distance away from the substrate and a second upper surface a second distance away from the substrate, the second distance being greater than the first distance, the second upper surface being adjacent to the liner. A conductive material is over and in physical contact with the sidewall and the top surface of the through silicon via.

In accordance with yet another embodiment, a semiconductor device comprising a through silicon via protruding from a substrate, the through silicon via having a sidewall, is provided. A liner extends along the sidewall away from the substrate, the liner terminating prior to reaching a top surface of the through silicon via. A passivation layer comprises a first upper surface a first distance away from the substrate and a second upper surface a second distance away from the substrate, the second distance being greater than the first distance, the second upper surface being adjacent to the liner. A conductive material is over and in physical contact with the sidewall and the top surface of the through silicon via.

In accordance with yet another embodiment, a semiconductor device comprising a through silicon via in a substrate, the through silicon via comprising sidewalls, is provided. A dielectric liner is adjacent to the sidewalls. A dielectric layer is over the substrate and adjacent to the dielectric liner, the dielectric layer having two different thicknesses, wherein the sidewall extends further from the substrate than the dielectric layer. A conductive material is in contact with the sidewalls of the through silicon via.

In accordance with yet another embodiment, a semiconductor device comprising a passivation layer over a first side of a substrate is provided. An opening is through the passivation layer and through the substrate and a liner is within the opening. A first conductive material is within the opening, wherein the first conductive material has a first portion that protrudes from the passivation layer over the first side of the substrate, the first portion having sidewalls, wherein the passivation layer has a second portion with a first thickness adjacent to and in contact with the first side of the substrate and a third portion with a second thickness extending along a sidewall of the first conductive material. A second conductive material is in physical contact with the sidewall of the first conductive material and a top surface of the first conductive material.

Although embodiments and their advantages have been described in detail, it should be understood that various changes, substitutions, and alterations can be made herein without departing from the spirit and scope of the embodiments. For example, the precise method and materials used to form the through silicon vias may be altered while still remaining within the scope of the embodiments. Additionally, composite layers may be used for the passivation layer or the liner while also still remaining within the scope of the embodiments.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a through silicon via protruding from a substrate, the through silicon via having a sidewall;
   a liner extending along the sidewall away from the substrate, the liner terminating prior to reaching a top surface of the through silicon via;
   a passivation layer comprising a first upper surface a first distance away from the substrate and a second upper surface a second distance away from the substrate, the second distance being greater than the first distance, the second upper surface being adjacent to the liner; and
   a conductive material over and in physical contact with the sidewall and the top surface of the through silicon via.

2. The semiconductor device of claim 1, wherein the conductive material further comprises:
   a glue layer; and
   a redistribution layer.

3. The semiconductor device of claim 1, wherein the conductive material comprises titanium.

4. The semiconductor device of claim 1, wherein the passivation layer and the liner both comprise a first material.

5. The semiconductor device of claim 4, wherein the first material comprises silicon nitride.

6. The semiconductor device of claim 1, wherein the passivation layer comprises a composite layer.

7. A semiconductor device comprising:
   a through silicon via in a substrate, the through silicon via comprising sidewalls;
   a dielectric liner adjacent to the sidewalls;
   a dielectric layer over the substrate and adjacent to the dielectric liner, the dielectric layer having two different thicknesses, wherein the sidewall extends further from the substrate than the dielectric layer; and
   a conductive material in contact with the sidewalls of the through silicon via.

8. The semiconductor device of claim 7, wherein the dielectric layer has a top surface that is planar with the dielectric liner.

9. The semiconductor device of claim 7, wherein the dielectric layer has a top surface that is not planar with the dielectric liner.

10. The semiconductor device of claim 7, wherein the conductive material is a redistribution layer.

11. The semiconductor device of claim 7, wherein the dielectric liner comprises a first material and the dielectric layer comprises the first material.

12. The semiconductor device of claim 11, wherein the first material is silicon nitride.

13. The semiconductor device of claim 7, further comprising a glue layer between the conductive material and the through silicon via.

14. The semiconductor device of claim 13, wherein the glue layer is titanium.

15. A semiconductor device comprising:
   a passivation layer over a first side of a substrate;
   an opening through the passivation layer and through the substrate;
   a liner within the opening;
   a first conductive material within the opening, wherein the first conductive material has a first portion that protrudes from the passivation layer over the first side of the substrate, the first portion having sidewalls, wherein the passivation layer has a second portion with a first thickness adjacent to and in contact with the first side of the substrate and a third portion with a second thickness extending along a sidewall of the first conductive material; and
   a second conductive material in physical contact with the sidewall of the first conductive material and a top surface of the first conductive material.

16. The semiconductor device of claim 15, further comprising:
   a glue layer between the first conductive material and the second conductive material; and
   a seed layer between the glue layer and the second conductive material.

17. The semiconductor device of claim 15, wherein the second conductive material is a redistribution layer.

18. The semiconductor device of claim 15, wherein the passivation layer comprises a first material and the liner comprises the first material.

19. The semiconductor device of claim 15, wherein the second conductive material comprises titanium.

20. The semiconductor device of claim 15, wherein the passivation layer comprises a composite layer.

* * * * *